United States Patent
Ben-Ayun et al.

(10) Patent No.: US 8,478,211 B2
(45) Date of Patent: Jul. 2, 2013

(54) ADAPTIVE CARTESIAN LOOP TRANSMITTER FOR BROADBAND AND OPTIMAL LOOP STABILITY ADJUSTMENT

(75) Inventors: Moshe Ben-Ayun, Shoham (IL); Avi Ben-Salmon, Reshon Letzion (IL); Ovadia Grossman, Tel Aviv-Jaffa (IL); Mark Rozental, Gedera (IL)

(73) Assignee: Motorola Solutions, Inc., Schaumburg, IL (US)

( * ) Notice: Subject to any disclaimer, the term of this patent is extended or adjusted under 35 U.S.C. 154(b) by 68 days.

(21) Appl. No.: 13/133,792

(22) PCT Filed: Dec. 8, 2009

(86) PCT No.: PCT/US2009/067051
§ 371 (c)(1),
(2), (4) Date: Jun. 9, 2011

(87) PCT Pub. No.: WO2010/068604
PCT Pub. Date: Jun. 17, 2010

(65) Prior Publication Data
US 2012/0001694 A1  Jan. 5, 2012

(30) Foreign Application Priority Data

Dec. 12, 2008 (GB) .................................. 0822730.8

(51) Int. Cl.
*H04B 1/04* (2006.01)
*H03F 1/32* (2006.01)
(52) U.S. Cl.
CPC .................................. *H03F 1/3247* (2013.01)

USPC .................... 455/114.3; 455/115.1; 455/126; 455/67.16

(58) Field of Classification Search
USPC ................ 455/114.3, 115.1, 115.2, 125, 126, 455/67.11, 67.13, 67.14, 67.16
See application file for complete search history.

(56) References Cited

U.S. PATENT DOCUMENTS

| 5,134,718 | A | * | 7/1992 | Gailus | .......................... 455/102 |
| 5,524,285 | A |   | 6/1996 | Wray et al. | |
| 5,565,814 | A | * | 10/1996 | Fukuchi | .......................... 330/52 |
| 5,574,992 | A | * | 11/1996 | Cygan et al. | .................. 455/126 |

(Continued)

FOREIGN PATENT DOCUMENTS

JP  2008211449 A  2/2007
WO 2004049558 A1  6/2004

OTHER PUBLICATIONS

GB Search Report and Examination Dated Apr. 9, 2009.
PCT International Search Report Dated Jul. 13, 2010.

*Primary Examiner* — Duc M Nguyen
(74) *Attorney, Agent, or Firm* — Daniel R. Bestor

(57) ABSTRACT

An integrated circuit includes a linearizer circuit in which excessive delay is compensated. The linearizer circuit includes a power amplifier, forward and feedback paths, and a microprocessor. A signal from the power amplifier is routed by the forward path to be transmitted while a portion of the signal to be transmitted is routed back to the power amplifier via the feedback path. The microprocessor applies phase training signals to the forward path. The microprocessor uses the phase training signals to determine the amount of delay in the linearizer circuit and alters the frequency position of poles and zeros in the linearizer circuit to compensate for the delay. The gain of the linearizer circuit is also altered by the microprocessor depending on the measured delay.

7 Claims, 7 Drawing Sheets

U.S. PATENT DOCUMENTS

| | | |
|---|---|---|
| 5,623,226 A | 4/1997 | Whitmarsh et al. |
| 5,675,286 A * | 10/1997 | Baker et al. .................. 330/129 |
| 5,990,734 A * | 11/1999 | Wright et al. ...................... 330/2 |
| 6,381,286 B1 | 4/2002 | Wilkinson et al. |
| 6,606,483 B1 * | 8/2003 | Baker et al. .................. 455/126 |
| 6,639,950 B1 * | 10/2003 | Lagerblom et al. ........... 375/297 |
| 6,947,712 B2 | 9/2005 | Sun et al. |
| 7,196,576 B2 * | 3/2007 | Mizuta et al. ................... 330/52 |
| 7,353,005 B2 * | 4/2008 | Ben-Ayun et al. ......... 455/115.2 |
| 7,848,449 B2 * | 12/2010 | Nagatani et al. .............. 375/296 |
| 7,974,593 B2 * | 7/2011 | Cole et al. .................. 455/114.3 |
| 8,254,856 B2 * | 8/2012 | Hue et al. ................... 455/114.3 |
| 2002/0058486 A1 | 5/2002 | Persson |
| 2007/0173213 A1 | 7/2007 | Ben-Ayun et al. |
| 2011/0007841 A1 * | 1/2011 | Ben-Ayun et al. ............ 375/297 |

* cited by examiner

ADAPTIVE CARTESIAN LOOP TRANSMITTER FOR BROADBAND AND OPTIMAL LOOP STABILITY ADJUSTMENT

CROSS REFERENCE TO RELATED APPLICATIONS

This application is a National Stage filing under 35 USC X371 of co-pending Patent Cooperation Treaty international application having Serial No. PCT/US09/67051 (the "PCT international application") filed on Dec. 8, 2009 and published as WO2010/068604 on Jun. 17, 2010. This application claims priority to the PCT international application and to prior Great Britain (GB) national application having Serial No. 0822730.8 filed on Dec. 12, 2008 and granted as GB 2466072 on Mar. 23, 2011, the priority of which was also claimed in the PCT international application. Both the PCT international application and the GB national application are assigned to MOTOROLA SOLUTIONS, Inc.

FIELD OF THE INVENTION

The present invention relates to radio linear transmitters. More specifically, it relates to a linear transmitter, which employs a linearization technique in order to provide stable, linear output.

BACKGROUND

Radio communication devices use transmitters and antennas to provide for the efficient transmission of radio frequency (RF) communication signals. The transmitter portion of a communication device includes a power amplifier to amplify the radio frequency signals before they are coupled to the antenna for transmission. As modern radio communication systems work in narrow frequency bands, the transmitters' circuitries require RF power amplifiers able to operate in a linear fashion. Linear amplification is used to prevent distortion of the modulated signal and minimize the interference. However non-linearity of real world RF amplifiers appears when they are operated at high drive levels near the saturation point. Similar situations may be caused by environmental conditions. For example, a transmitter operating near an electromagnetically reflective structure may be susceptible to energy reflected back through the antenna into the transmitter.

There are known in the art transmitters with improved linearity. One method of linearization of transmitters is to use a Cartesian feedback loop based linearizer circuit. The Cartesian feedback linearizer permits linearity of the transmitter to be maintained while still allowing RF power amplifier to work close to its saturation point, thus maintaining good efficiency. To protect against changes in load impedance as a result of reflected energy, an isolator or circulator is often inserted between the antenna and the power amplifier. The isolator protects the power amplifier by absorbing the reflected energy and preventing it from reaching the amplifier. The isolator directs the reflected energy to an absorptive load termination. Although the isolator generally works well, it adds significant cost, size, and weight to the design of a radio communication device. Isolators are narrowband, expensive and have large physical dimensions (especially at low frequencies).

A linearizer circuit, such as a Cartesian feedback linearizer, optimizes a performance of a transmitter, for example, to comply with linearity or output power specifications of a communication system, or optimizes an operating efficiency of the transmitter power amplifier. Operational parameters of the transmitter are adjusted to optimize the transmitter performance and include amplifier bias voltage level, input power level, and phase shift of a signal around a feedback path. Such adjustments are performed by a microprocessor.

Due to sensitivity performance of such transmitter circuits, a range of control and adjustment circuits and/or components are used so that a linear and stable output signal can be achieved under all operating circumstances.

All linearization techniques require a finite amount of time in which to linearize the performance of a given amplifying device. The linearization of the amplifying device is often achieved by initially applying a training sequence to a linearizer circuit and an amplifying device in order to determine levels of phase and gain distortion introduced by the linearization loop and the amplifying device. Once phase and gain distortion levels have been determined, they can be compensated for, generally by adjusting feedback components/parameters.

To accommodate for such a linearization technique, communication systems typically allocate specific training periods for individual users to train their transmitters. The TErrestrial Trunked RAdio (TETRA) standard includes a time frame, termed a Common Linearization Channel (CLCH) as is described in UK Patent Application No. 9222922.8, to provide a full-training period approximately once every second. The CLCH frame allows a radio to train prior to gaining access to the TETRA communication system. However, a radio having to wait up to one second before training and then accessing the system is undesirable. To minimize the effect of this significant delay in call set-up times, and also provide an additional period for fine tuning a radio's output characteristics, e.g., due to changes in temperature, supply voltage or frequency of operation, a reduced training sequence has been inserted at the beginning of each TETRA traffic time slot for a radio allocated that slot to perform a minimal amount of training or fine tuning. This period may be used for phase training.

An example of such a training sequence is described in U.S. Pat. No. 5,066,923 to Motorola Inc., which describes a training scheme where a phase of a transmitter amplifier is adjusted in an 'open-loop' mode and a gain of a transmitter amplifier is adjusted when a feedback loop is closed.

During phase training, a Cartesian feedback linearizer may be configured to be 'open loop,' for example, a switch may be used to prevent the feedback signal from being combined with a signal routed through the transmitter.

FIG. 1 illustrates a phase diagram 100 with a perfect I/Q quadrature balance, namely a 90-degree phase difference between the I-channel 120 and the Q-channel 110. One known method for controlling/setting phase and amplitude levels around a feedback loop is described here. The Cartesian loop may be opened and a positive baseband signal applied to an input of the I-channel. Phase training control circuitry monitors a signal before switching on a Q-channel, indicated as $V_{FQ}$ 140. A successive approximation register (SAR) phase training algorithm controls a phase shifter and is arranged to minimize the $V_{FQ}$ voltage. Once the SAR algorithm has completed, a phase correction signal corrects a loop phase from $V_{FQ}$ 140 to $V_{FQ\_T}$ 130 by an angle β 150. A voltage value measured on the Q-channel prior to the switch may then be reduced to a level close to zero. In one embodiment of the invention, the phase training and adjustment process is repeated for a negative baseband signal input to the I-channel. Calculated results from both positive and negative training applied to the I-channel are averaged and used to adjust a phase shift around both the I-channel loop and the Q-channel loop. In practice, a perfect I-Q 90-degree relationship is rarely achieved. This imbalance results from various component tolerances within the respective I and Q loops.

Cartesian feedback linearizers can be readily implemented for use with narrowband protocols having a channel bandwidth up to 150 kHz, such as TETRA, TETRA2, iDEN, and HSD/HPD, using the above described techniques. However, it would be desirable to use a Cartesian feedback linearizer with broadband protocols, which are protocols transmitted above 150 kHz, such as at LTE (Long Term Evolution), WiMax, WCDMA and EDGE, for at least the following reasons: 1) improved efficiency and higher power output for a given RF power amplifier; 2) improved Adjacent Channel Coupled Power (ACCP) for using an adjacent channel in an adjacent cell; and 3) improved EVM (Error Vector Magnitude). One problem with using a Cartesian feedback linearizer with broadband protocols is loop instability, which is due to increased delay in the transmitter path. If the delay in the transmitter path when using a broadband protocol is relatively large, then the stability of the Cartesian feedback linearizer can be at risk.

FIG. 2 illustrates a Cartesian feedback linearizer circuit 200. The bandwidth and stability of the Cartesian feedback linearizer circuit 200 is defined by loop gain, poles, and zeros of the loop. The loop in FIG. 1 has two poles, $LP_1$ and $LP_2$, and a zero $Z_1$. A $1^{st}$ fixed pole is at $LP_1$ and a $2^{nd}$ programmable pole is at $LP_2$ along with a programmable zero $Z_1$.

A signal having I and Q components, for example a narrowband signal such as a 25 kHz TETRA1 signal or a broadband signal such as a 5 MHz LTE signal, is input as an I-channel input 202 and a Q-channel input 230 into summing junctions 204, 232, respectively. The summed I channel input signal 202 is then input to a series of amplifiers $A_1$ 205 and $A_2$ 207 and a series of low-pass filters $LP_1$ 206 and $LP_2$+Zero 209, where the signal is amplified and filtered. The summed Q channel input signal 230 is also input to a series of amplifiers $A_1$ 233 and $A_2$ 235 and a series of low-pass filters $LP_1$ 234 and $LP_2$+Zero 237, where the signal is amplified and filtered. The amplified input signals 202, 232 are then up-converted by mixing them with a signal from local oscillator 240 in mixers 208, 238, respectively.

The up-converted signals are summed in a summing junction 210 and then routed to an RF power amplifier 212, where a portion of an amplified RF signal is fed back via a directional coupler 214 and the rest of the amplified RF signal is transmitted through an antenna 216. The portion of the amplified RF signal is routed to a down-conversion mixers 218 and 220 where it is mixed with a phase-shifted version of a signal from the local oscillator 240, the phase-shifted version of the local oscillator signal having been phase-shifted by a phase shifter 242.

Looking at FIG. 2, an example of the problem that increased delay can have on the stability of a Cartesian feedback linearizer circuit can be illustrated through two examples. In one example, if the Cartesian feedback linearizer circuit 200 is used to transmit a narrowband signal such as a 25 kHz TETRA1 signal, assuming: low-pass filters $LP_1$ 206, 234 are set at 2.7 kHz; low-pass filters $LP_2$ 209, 237 are set at 18 kHz; and the programmable Zero for low-pass filters $LP_2$ 209, 237 is set at 390 kHz; then the bandwidth for the Cartesian feedback linearizer circuit would be 407 kHz and the phase margin would be 48 degrees. However, if the Cartesian feedback linearizer circuit 200 is used to transmit a broadband signal such as a 5 MHz LTE signal, using a scaling factor of 200 (5 MHz/25 kHz=200), and assuming: low-pass filters $LP_1$ 206, 234 are set at 2.7*200=540 kHz; low-pass filters $LP_2$ 209, 237 are set at 18*200=3600 kHz; and the programmable Zero $Z_1$ for low-pass filters $LP_2$ 209, 237 is set at 390*200=78000 kHz; then the bandwidth for the Cartesian feedback linearizer circuit would be 407*200=81400 kHz and the phase margin, assuming no delays in the lines of the Cartesian feedback linearizer circuit, would still be 48 degrees.

However, it is not uncommon for there to be a delay introduced into the lines of the Cartesian feedback linearizer circuit, due to the RF power amplifier, couplers, baluns, and other elements which could be introduced into the Cartesian feedback linearizer circuit. The delay can also be a function of VSWR (voltage standing wave ratio), the RF power amplifier supply voltage, temperature, and RF frequency. Assuming a delay of 10 nanoseconds, the phase shift due to this delay for the narrowband 25 kHz TETRA1 signal would be:

$$\Delta\phi = 360 * Floop * \tau = 360 * 407 \text{ kHz} * 10 \text{ n sec} = 1.5 \text{ deg} \quad \text{(Equation 1)}.$$

This delay would not significantly affect the stability of the Cartesian feedback linearizer circuit. However, if a delay of 10 nanoseconds where introduced into the Cartesian feedback linearizer circuit producing the broadband 5 MHz LTE signal, the phase shift due to this 10 ns delay would be:

$$\Delta\phi = 360 * Floop * \tau = 360 * 81400 \text{ kHz} * 10 \text{ n sec} = 293 \text{ deg} \quad \text{(Equation 2)}.$$

The above phase shift of 293 degrees would significantly affect the stability of the Cartesian feedback linearizer circuit, and result in an unstable circuit. For the feedback loop to be stable, the overall phase shift of the feedback loop at loop bandwidth should be less then 180 degrees. Phase margin is defined as the difference between 180 degrees and the phase shift at 0 db loop bandwidth frequency.

Phase shifts due to a delay introduced into the broadband Cartesian feedback linearizer circuit present another problem that does not exist in narrowband Cartesian feedback linearizer circuits: gain margin. Since the phase shifts due to a delay increase linearly with frequency, when the phase of the Cartesian feedback linearizer circuit is 180 degrees or more, sufficient gain margin should be present. In order to insure that sufficient gain margin is present, an additional programmable Zero, $Z_2$, is used with low-pass filters $LP_2$ 209, 237 at frequencies above 150 MHz in order to ensure stability. The phase shift due to a delay introduced into the broadband Cartesian feedback linearizer circuit, also known as delay line phase shift, for a circuit which operates with signals above 150 MHz, can be at least three times larger then for a circuit which operates with signals at, for example, 50 MHz. For example, if at 50 MHz a signal has a delay line phase of 35 degrees, then at 150 MHz a signal may have a delay line phase of 105 degrees, for example.

As a result, delays introduced into broadband Cartesian feedback linearizer circuits can have a significant effect on the operation and stability of the circuits. Thus, there exists a need to provide an improved wireless communication unit with linearizer circuit, wherein the abovementioned disadvantages may be alleviated.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION

By measuring delay introduced into a Cartesian feedback linearizer circuit the stability if the circuit can be improved, especially for a Cartesian feedback linearizer circuit which operates with broadband signals.

Figure 1:
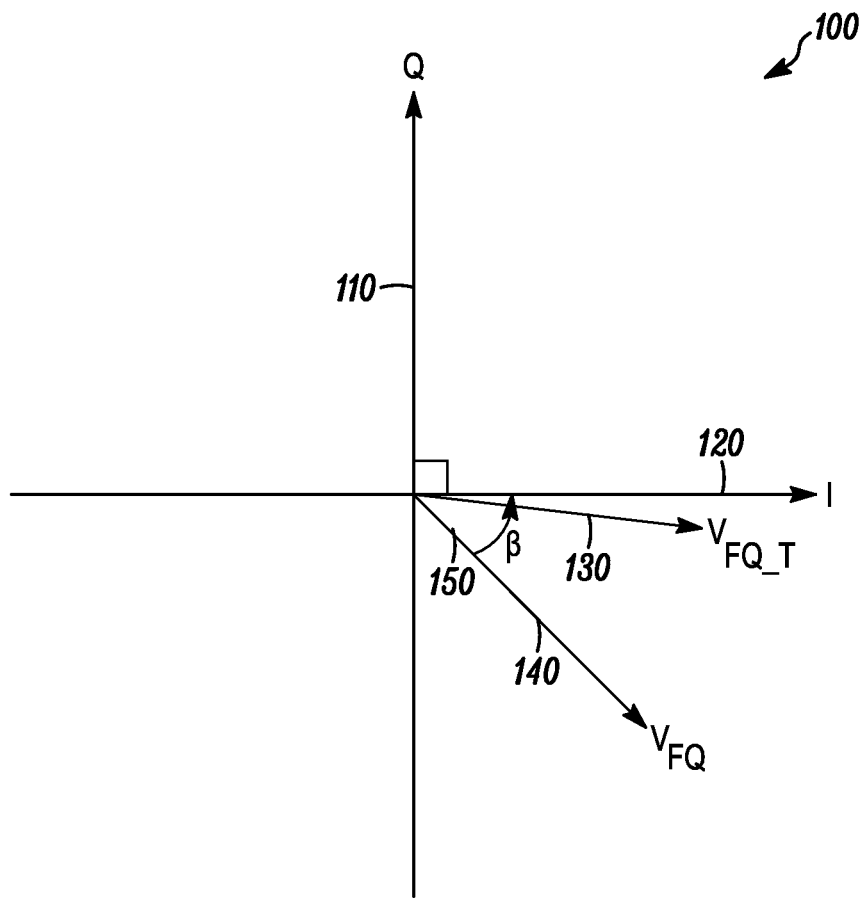
FIG. 1 depicts a known phase diagram of an unbalanced I-Q relationship in a feedback loop of a linear transmitter arrangement.
Figure 2:
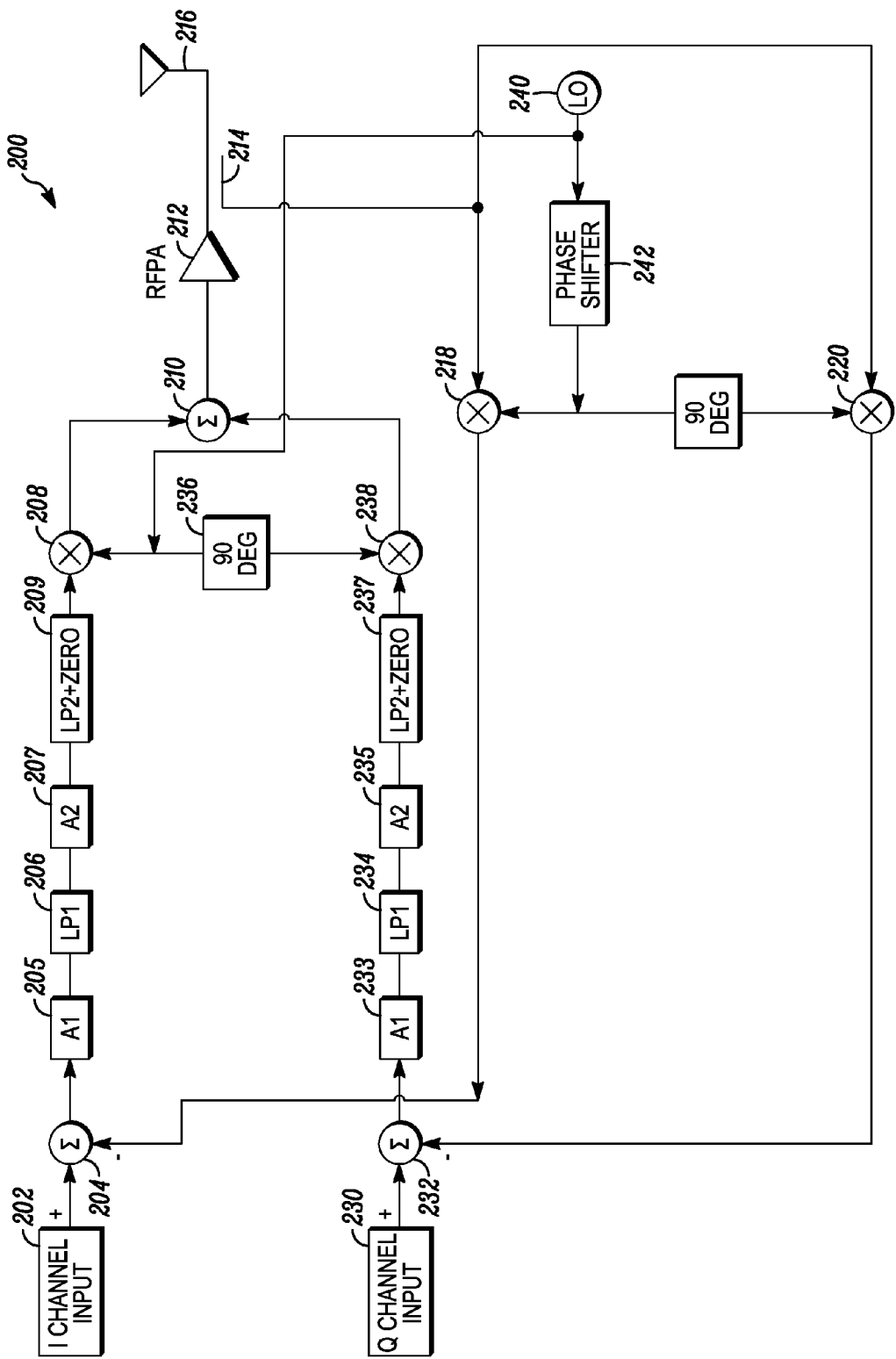
FIG. 2 depicts a block diagram of a Cartesian feedback linearizer circuit.
Figure 3A:
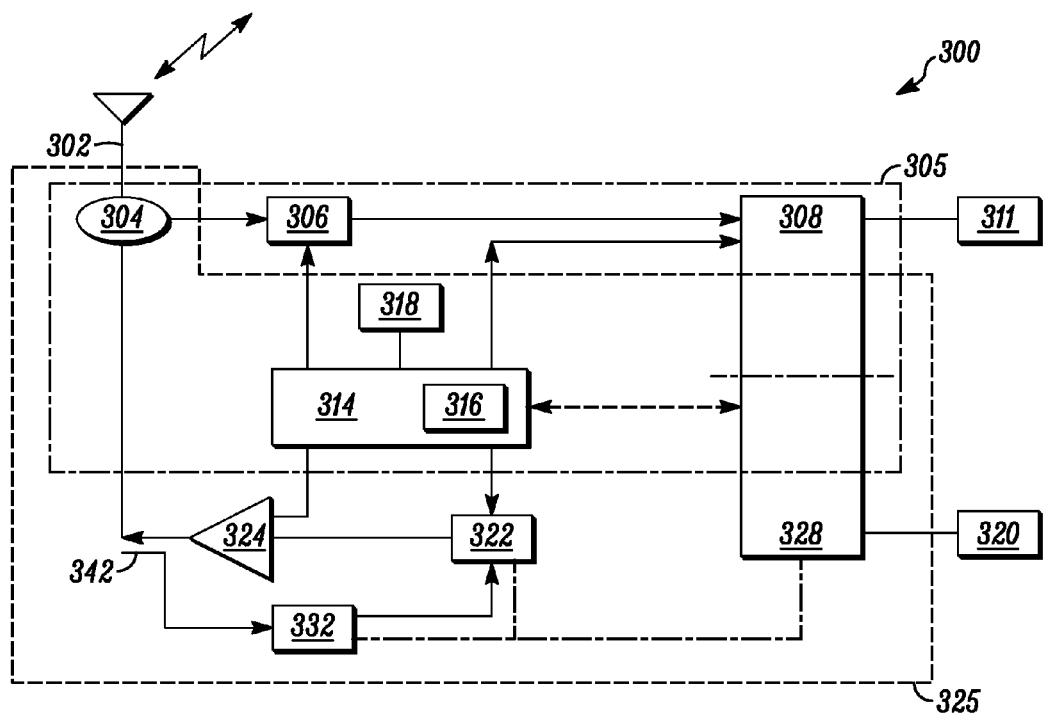
FIG. 3A depicts a block diagram of a wireless communication unit, in accordance with one embodiment of this invention.

Generally speaking, the various embodiments provide a wireless communication unit, a linearized transmitter integrated circuit and improved method of linearizing a transmitter for improving amplitude and phase training accuracy Referring now to FIG. 3A, there is shown a block diagram of a wireless TETRA subscriber communication unit 300 adapted to support embodiments of the invention. For the sake of clarity, the wireless TETRA subscriber communication unit 300 is shown as divided into two distinct portions: a receiver chain 305 and a transmitter chain 325.

The wireless TETRA subscriber communication unit 300 contains an antenna 302. The antenna 302 is coupled to an antenna switch 304 that provides signal control of RF signals in the wireless TETRA subscriber communication unit 300, as well as isolation between the receiver chain 305 and transmitter chain 325. Clearly, the antenna switch 304 may be replaced with a duplex filter, for frequency duplex communication units, as is known to those skilled in the art.

For completeness, the receiver chain 305 of the wireless TETRA subscriber communication unit 300 will be briefly described. The receiver chain 305 includes receiver front-end circuit 306 (effectively providing reception, filtering and intermediate or base-band frequency conversion). The receiver front-end circuit 306 is serially coupled to signal processing logic (generally realized by at least one digital signal processor (DSP)) 308. A controller 314 is operably coupled to the receiver front-end circuit 306. The controller 314 is arranged to perform overall functional control of the wireless TETRA subscriber communication unit 300. A memory device 316 stores a wide array of data, such as decoding/encoding functions and the like, as well as amplitude and phase settings for the linearized transmitter to ensure a linear and stable output. A timer 318 is operably coupled to the controller 314 to control the timing of operations, namely the transmission or reception of time-dependent signals.

As regards the transmit chain 325, this essentially includes signal processing logic 328, linearizer circuitry (including transmitter/modulation circuitry) 322 and an up-converter/power amplifier 324. The signal processing logic 328, linearizer circuitry 322 and the up-converter/power amplifier 324 are operationally responsive to the controller 314, with an output from the power amplifier 324 coupled to the antenna switch 304. A feedback circuit includes a down-converter 332, which forms together with the linearizer circuitry 322 power amplifier 324 and directional coupler 342 a real-time Cartesian feedback loop to ensure a linear, stable transmitter output.

Prior to transmitting real data, the linearized transmitter employs a training algorithm to determine appropriate gain and phase adjustment parameters to apply to components within the loop to ensure a stable, linear output. Notably, a mechanism to determine the amount of delay in the linearizer circuit and change parameters within the linearizer circuit, such as the poles and zeroes in a gain and low-pass filter block, is provided in order to compensate for the delay and operate the linearizer circuit with improved efficiency.

Figure 3B:
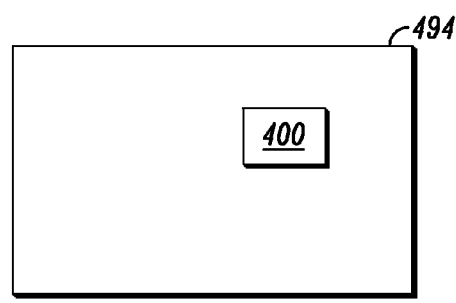
FIG. 3B depicts a block diagram of an integrated circuit which includes a quadrature generator in communication with the Cartesian feedback linearizer circuit of FIG. 3, in accordance with one embodiment of the present invention.
Figure 4:
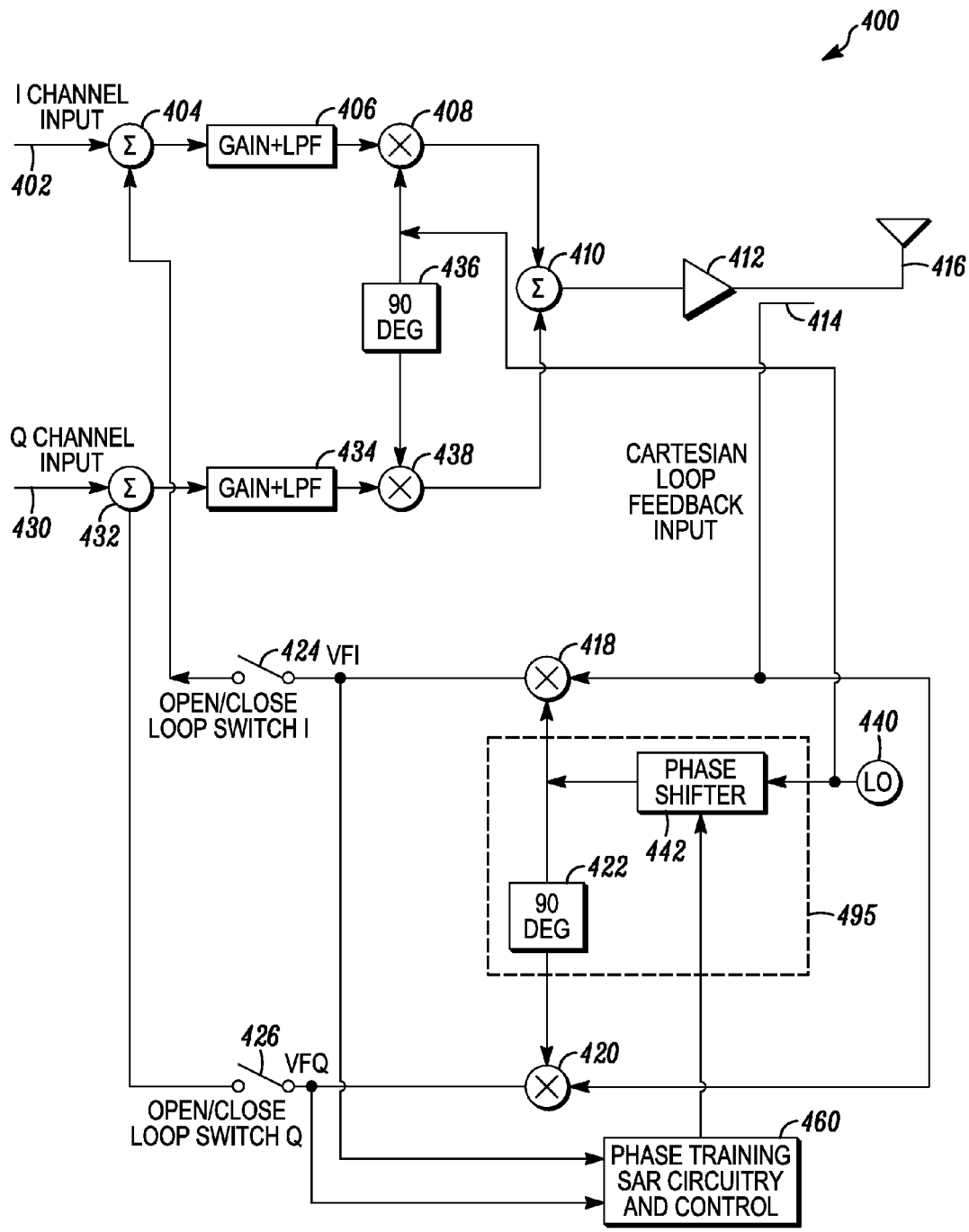
FIG. 4 depicts a block diagram of a Cartesian feedback linearizer circuit, in accordance with one embodiment of the present invention.

FIG. 4 shows a Cartesian feedback linearizer circuit 400, which is one part of an integrated circuit 494, as shown in FIG. 3B.

The training algorithm begins by having local oscillator 440 generate an RF signal of frequency $F_1$, and applying a positive baseband signal to the input of I-channel 402. The positive baseband signal is not combined with any other signal in summing junction 404, as the circuit 400 has been arranged for open-loop operation by opening switch 424 (and similarly by later opening the switch 426 for Q-channel 430). The positive baseband signal is then input to a gain and low-pass filter block 406 where it is amplified and filtered. The gain and low-pass filter block 406 preferably includes a programmable pole, $LP_P$, with at least one programmable zero, $Z_1$, and preferably a second programmable zero, $Z_2$. The amplified input signal is then up-converted by mixing it with a signal from local oscillator 440 in a mixer 408.

The up-converted signal is then routed to an RF power amplifier 412, where a portion of an amplified RF signal is fed back via directional coupler 414 and the rest of the amplified RF signal is transmitted through an antenna 416. The portion of the amplified RF signal is routed to down-conversion mixer 418, where it is mixed with a phase-shifted 442 version of a signal from local oscillator 440, phase-shifted by a phase-shifter 442. An amount of phase shift to be introduced to one or more components within the feedback loop is controlled by a phase calculation and adjustment function 460, which runs a SAR algorithm. In determining the amount of phase shift, the phase calculation and adjustment function 460 monitors the positive baseband signal before switching on the Q channel 430, by opening the switch 426. The phase training SAR circuitry and control 460 controls the phase shifter 442 and minimizes the $V_{FQ}$ voltage applied to the Q channel 430. At the end of the SAR algorithm, the phase training SAR circuitry and control 460 corrects the loop phase by angle $\beta_{1P}$. The voltage before the switch 426 in the Q channel 430 becomes close to zero.

Then, a negative baseband signal is applied to the input of I-channel 402. The negative baseband signal is not combined with any other signal in summing junction 404, as the circuit 400 has been arranged for open-loop operation by opening switch 424 (and similarly by later opening the switch 426 for Q-channel 430). The negative baseband signal is then input to a gain and low-pass filter block 406 where it is amplified and filtered. The gain and low-pass filter block 406 preferably includes a programmable pole, $LP_P$ with at least one programmable zero, $Z_1$, and preferably a second programmable zero, $Z_2$. The amplified input signal is then up-converted by mixing it with a signal from local oscillator 440 in a mixer 408.

The up-converted signal is then routed to an RF power amplifier 412, where a portion of an amplified RF signal is fed back via directional coupler 414 and the rest of the amplified RF signal is transmitted through an antenna 416. The portion of the amplified RF signal is routed to down-conversion mixer 418, where it is mixed with a phase-shifted version of a signal from local oscillator 440, phase-shifted by the phase-shifter 442. An amount of phase shift to be introduced to one or more components within the feedback loop is controlled by a phase calculation and adjustment function 460, which runs a SAR algorithm. In determining the amount of phase shift, the phase calculation and adjustment function 460 monitors the negative baseband signal before switching on the Q channel 430, by opening the switch 426. The phase training SAR circuitry and control 460 controls the phase shifter 442 and minimizes the $V_{FQ}$ voltage applied to the Q channel 430. At the end of the SAR algorithm, the phase training SAR circuitry and control 460 corrects the loop phase by angle $\beta_{1N}$. The voltage before the switch 426 in the Q channel 430 becomes close to zero. Then $\beta_{1P}$ and $\beta_{1N}$ are averaged, resulting in a phase shift of $\beta_1$. Once the respective phase-shifts have been averaged and a phase shift of $\beta_1$ is determined, the phase shift $\beta_1$ is compensated for by appropriate adjustment of the phase-shifter, under control of the phase calculation and loop adjustment function 460.

Once a phase training process has been performed, resulting in a quadrature balance in phase between I-channel and Q-channel, a mechanism to compensate for quadrature amplitude imbalance between the I-channel and the Q-channel within the loop may be performed in a manner similar to the above.

Figure 5:
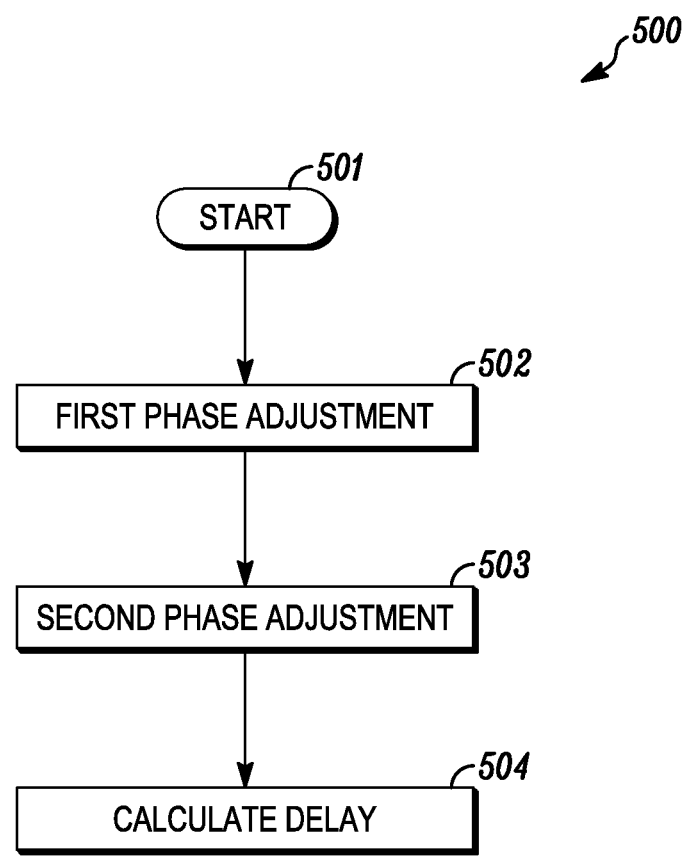
FIG. 5 depicts a flowchart illustration of a delay algorithm used to determine the amount of delay in a Cartesian feedback linearizer circuit.

Notably, the linearizer circuit 400 incorporates a series of phase adjustments in order to determine the amount of delay in the Cartesian feedback linearizer circuit 400. As illustrated in the flowchart of FIG. 5, a delay calculating algorithm 500 is used to calculate the delay in the linearizer circuit 400. The delay calculating algorithm 500 is started in step 501 and begins with a first phase adjustment in step 502, wherein a first training algorithm begins by having local oscillator 440 generate an RF signal of frequency $F_1$. As a result of the first training algorithm, a phase shift $\beta_1$ is calculated. Then, a second phase adjustment is started in step 503, wherein a second training algorithm begins by having local oscillator 440 generate an RF signal of frequency $F_2$. Frequency $F_2$ is equivalent to the first frequency $F_1$ plus an offset amount $\Delta F$. $\Delta F$ is greater than zero. Preferably, $F_2$ is at least 0.001% greater than $F_1$. As a result of the second training algorithm, a phase shift $\beta_2$ is calculated. Then, in step 504, the phase shift due to delay $\Delta\phi\_delay$ in the Cartesian feedback linearizer circuit 400 is indirectly determined by through calculating the phase shift due to delay $\Delta\phi\_delay$ in the Cartesian feedback linearizer circuit 400. The phase shift due to delay $\Delta\phi\_delay$ is calculated by taking the difference between the first phase shift $\beta_1$ and the second phase shift $\beta_2$, and adding in a measured phase shift $\gamma$ for the quadrature generator 495, using the following equation:

$$\Delta\phi\_delay = \beta_2 - \beta_1 + \gamma \quad \text{(Equation 3)}.$$

where $\gamma$ is a function of RF frequency and is known for a particular integrated circuit through measurement. $\gamma$ represents the phase shift in degrees which occurs inside the quadrature generator 495, and can vary from one integrated circuit to another. Once the phase shift due to the delay $\Delta\phi\_delay$ in the Cartesian feedback linearizer circuit 400 is calculated, it can be expressed in degrees per MHz, by taking the phase shift due to delay $\Delta\phi\_delay$ and dividing it by the offset amount $\Delta F$. For example, in one integrated circuit, the phase shift due to the phase shift due to delay $\Delta\phi\_delay$ is calculated as being 35 degrees, $F_1$=400 MHz, $F_2$=450 MHz, the offset amount $\Delta F$ is 50 MHz ($F_2 - F_1$), and therefore the $\Delta\phi\_delay$/MHz is calculated as 35 degrees/50 MHz, which equals 0.7 degrees/MHz.

Once the phase shift due to the delay is calculated, then it may be determined if it is possible to manufacture the Cartesian feedback linearizer circuit 400. If the phase shift due to the delay is above a maximum value $\Delta\phi\_delay_{max}$, then it is not possible to make the Cartesian feedback linearizer circuit 400 stable. The maximum value $\Delta\phi\_delay_{max}$ is the maximum amount of phase shift which the Cartesian feedback linearizer circuit 400 can operate under, beyond which the Cartesian feedback linearizer circuit 400 become unstable. The maximum value $\Delta\phi\_delay_{max}$ is different for each Cartesian feedback linearizer circuit 400, and can be either calculated or determined via experimentation. However, if the phase shift due to the delay is below a maximum value $\Delta\phi\_delay_{max}$, then it is possible to make the Cartesian feedback linearizer circuit 400 stable and implement an adaptive algorithm to insure optimum stability and loop gain for the Cartesian feedback linearizer circuit 400.

Figure 6:
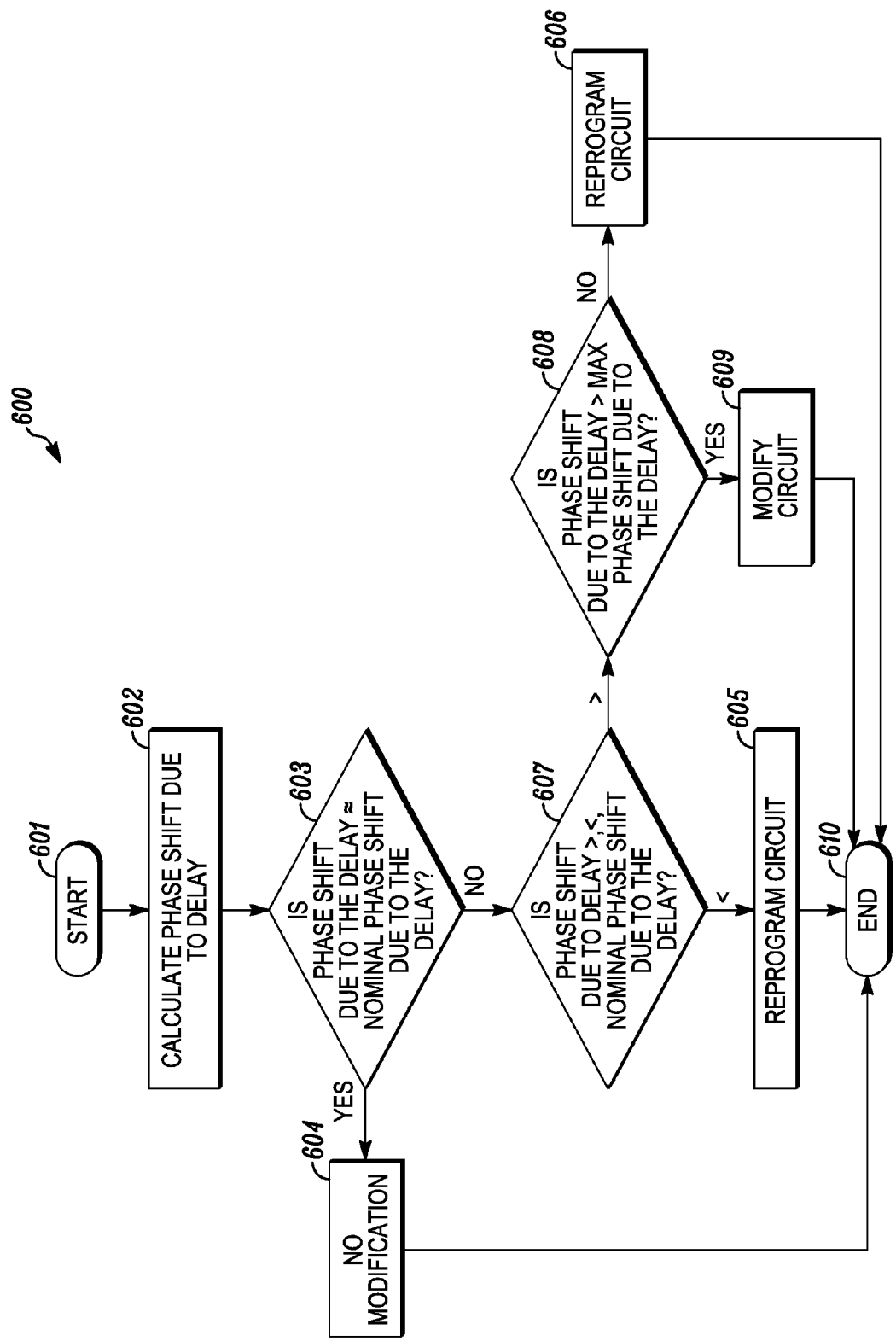
FIG. 6 depicts a flowchart illustration of an adaptive algorithm used to adjust a Cartesian feedback linearizer in order to compensate for a determined amount of delay.

As illustrated in the flowchart of FIG. 6, an adaptive algorithm 600 begins in step 601, wherein a measured phase shift due to the delay $\Delta\phi\_delay_{measured}$ in the linearizer circuit 400 is calculated in step 602, using the phase shift due to the delay calculating algorithm 500 shown in FIG. 5. Once the measured phase shift due to the delay $\Delta\phi\_delay_{measured}$ is calculated, the adaptive algorithm 600 moves to a decision step 603, wherein it is determined if the measured phase shift due to the delay $\Delta\phi\_delay_{measured}$ is equal, or within ±5%, to some nominal phase shift due to the delay $\Delta\phi\_delay_{nom}$, or nominal delay. The nominal delay is some predetermined amount of delay in circuit 400 which results in stable operation of the circuit 400. Then, if the measured phase shift due to the delay $\Delta\phi\_delay_{measured}$ is not equal, or not within ±5%, to some nominal phase shift due to the delay $\Delta\phi\_delay_{nom}$, the adaptive algorithm moves to a decision step 607, wherein it is determined if the measured phase shift due to the delay $\Delta\phi\_delay_{measured}$ is greater than the nominal phase shift due to the delay $\Delta\phi\_delay_{nom}$ or less than the nominal phase shift due to the delay $\Delta\phi\_delay_{nom}$. If the measured phase shift due to the delay $\Delta\phi\_delay_{measured}$ is generally equal to some nominal phase shift due to the delay $\Delta\phi\_delay_{nom}$, the adaptive algorithm 600 moves to step 604, the Cartesian feedback linearizer circuit 400 is not modified, the poles, zeros, and DC gain all operate with their nominal values, and then the algorithm 600 moves to an end at step 610.

If the measured phase shift due to the delay $\Delta\phi\_delay_{measured}$ is less than the nominal phase shift due to the delay $\Delta\phi\_delay_{nom}$, then the algorithm 600 moves to step 605, and the programmable zero, or zeros, will be reprogrammed accordingly to have higher values. Preferably, the zeroes will be reprogrammed to have an adjusted value which is proportionally higher than the nominal value of zeroes. The adjusted value of the zeroes compared with the nominal value of the zeroes is proportional to the $\Delta\phi\_delay_{nom}$/MHz compared with the $\Delta\phi\_delay_{actual}$/MHz. Additionally, the DC Gain of the Cartesian feedback linearizer circuit 400 is also proportionally increased to an adjusted value, at step 605. The adjusted value of the DC Gain compared with the nominal value of the DC Gain is proportional to the $\Delta\phi\_delay_{nom}$/MHz compared with the $\Delta\phi\_delay_{actual}$/MHz. As a result, the loop gain of the Cartesian feedback linearizer circuit 400 will increase accordingly, and the algorithm 600 moves to an end at step 610.

If the measured phase shift due to the delay $\Delta\phi\_delay_{measured}$ is greater than the nominal phase shift due to the delay $\Delta\phi\_delay_{nom}$, then the algorithm 600 moves to a decision step 608, wherein it is determined if the measured phase shift due to the delay $\Delta\phi\_delay_{measured}$ is greater than the predetermined maximum phase shift due to the delay $\Delta\phi\_delay_{max}$. If the measured phase shift due to the delay $\Delta\phi\_delay_{measured}$ is greater than the predetermined maximum phase shift due to the delay $\Delta\phi\_delay_{max}$, then the algorithm 600 moves to a step 609, wherein the Cartesian feedback linearizer circuit 400 is modified.

If the measured phase shift due to the delay $\Delta\phi\_delay_{measured}$ is not greater than the predetermined maximum phase shift due to delay $\Delta\phi\_delay_{max}$, then the algorithm 600 moves to a step 606, and the programmable zero, or zeros, will be reprogrammed accordingly to have lower values. Preferably, the zeroes will be reprogrammed to have an adjusted value which is proportionally lower than the nominal value of zeroes. The adjusted value of the zeroes compared with the nominal value of the zeroes is proportional to the $\Delta\phi\_delay_{nom}$/MHz compared with the $\Delta\phi\_delay_{actual}$/MHz. Additionally, the DC Gain of the Cartesian feedback linearizer circuit 400 is also proportionally decreased to an adjusted value, at step 606. The adjusted value of the DC Gain compared with the nominal value of the DC Gain is proportional to the $\Delta\phi\_delay_{nom}$/MHz compared with the $\Delta\phi\_delay_{actual}$/MHz. As a result, the loop gain of the Cartesian feedback linearizer circuit 400 will decrease accordingly, and the algorithm 600 moves to an end at step 610.

If the measured phase shift due to the delay $\Delta\phi\_delay_{measured}$ is greater than a maximum phase shift due to the delay $\Delta\phi\_delay_{max}$, then the algorithm 600 will move to step 609, and the Cartesian feedback linearizer circuit 400 will be modified by scaling the circuit 400 to support a signal having a lower bandwidth, and the linearizer circuit 400 will inform the system encompassing the linearizer circuit 400 that the linearizer circuit 400 is now transmitting a signal having a lower bandwidth. Alternatively, if the phase shift due to the delay is greater than a maximum delay $\Delta\phi\_delay_{max}$, the Cartesian feedback linearizer circuit 400 may alternatively be modified by leaving the circuit 400 in an open loop state to insure stability, at step 609. Upon completing step 609, the algorithm 600 moves to an end at step 610.

Preferably, upon ending, the algorithm 600 is performed again each time phase training for the Cartesian feedback linearizer circuit 400 is performed. Alternatively, upon ending, the algorithm 600 is performed repeatedly after a set amount of time has passed.

Figure 7:
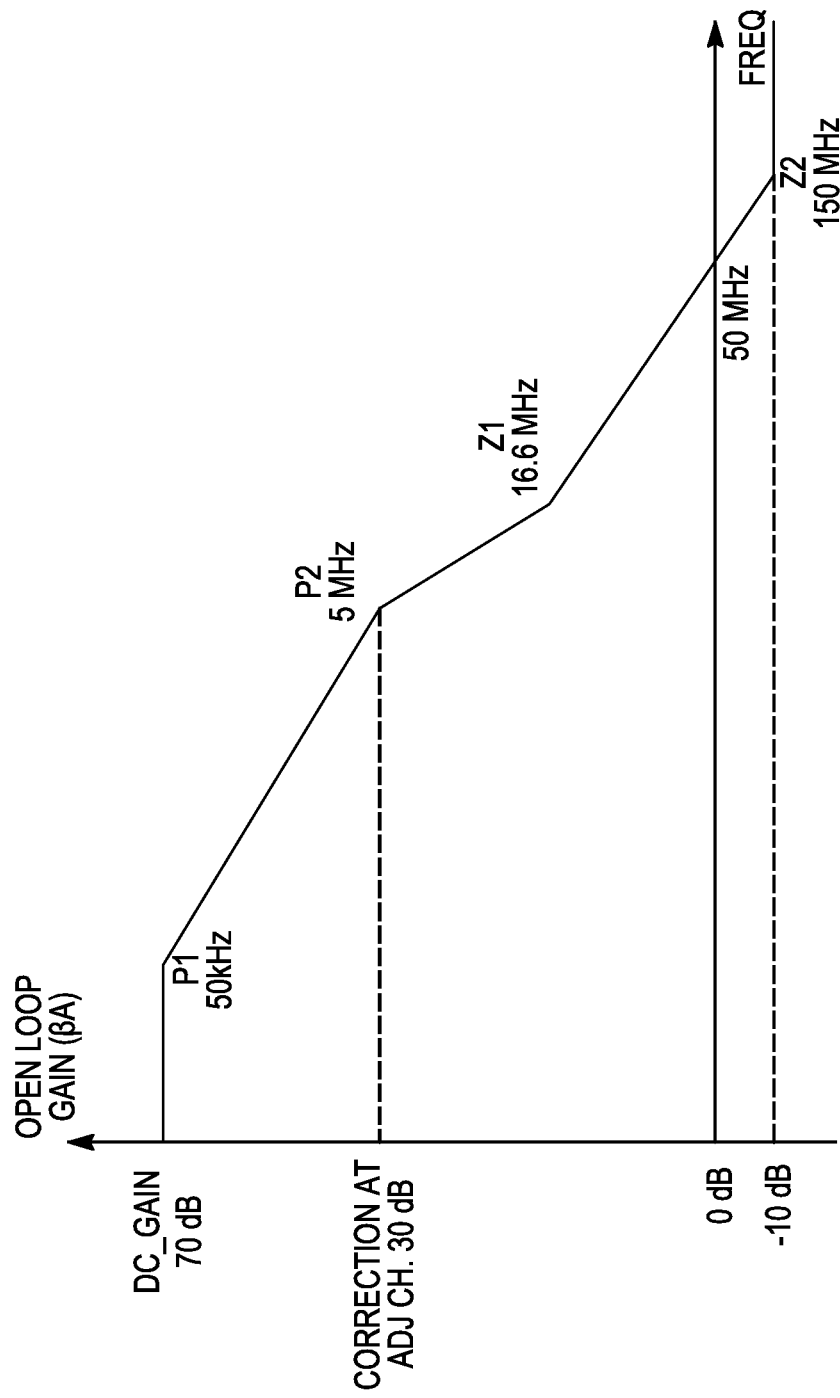
FIG. 7 depicts a Bode plot of a Cartesian feedback linearizer loop design for a 5 MHz LTE device.

An example of algorithm 600 in action, shown in FIG. 7, and is provided as follows. Assuming a Cartesian feedback linearizer circuit 400 designed to transmit a broadband 5 MHz LTE signal, having a first pole P1 at 50 kHz, a second pole P2 at 5 MHz, a first zero Z1 at 16.6 MHZ, a second zero Z2 at 150 MHz, and a DC gain of 70 dB, a nominal phase shift due to the delay $\Delta\phi\_delay_{nom}$ is calculated for the circuit. The above Cartesian feedback linearizer circuit 400 results in a phase margin of 77 degrees. Assuming that a 42 degree phase margin is needed, a 'delay line' with a phase shift of 35 degree at 50 MHz is allowable. The zero dB open loop gain frequency of the above loop is then 50 MHz, as shown in FIG. 7. This results in a nominal phase shift due to the delay of 35 degrees per 50 MHz, or $\Delta\phi\_delay_{nom}$ of 0.7 degrees/MHz. Then the phase shift due to the delay in the Cartesian feedback linearizer circuit 400 is calculated using the delay calculating algorithm 500. If the calculated phase shift due to the delay is less than the nominal phase shift due to the delay of $\Delta\phi\_delay_{nom}$ of 0.7 degrees/MHz, then the zeros are adjusted upwards, and Z1 will gradually and proportionally move from 16.6 MHz up to 50 MHz and Z2 will gradually and proportionally move from 150 MHz up to 300 MHz. Additionally, the DC Gain will gradually and proportionally move from a nominal 70 dB to 80 dB. The loop gain at 5 MHz adjacent channel will increase from 30 dB to 40 dB. If the calculated phase shift due to the delay is greater than the nominal phase shift due to the delay of $\Delta\phi\_delay_{nom}$ of 0.7 degrees/MHz (but less then the maximum allowed phase shift due to the delay), then the zeros are adjusted downwards, and Z1 will gradually and proportionally move from 16.6 MHz up to 5 MHz and Z2 will gradually and proportionally move from 200 MHz up to 100 MHz. Additionally, the DC Gain will gradually and proportionally move from a nominal 70 dB to 60 dB. The loop gain at 5 MHz adjacent channel will increase from 30 dB to 20 dB.

By constantly changing the values Z1, Z2 of the programmable zeros and by constantly changing the value of the DC Gain as a function of the measured phase shift due to the delay $\Delta\phi\_delay_{measured}$, it is possible to maintain the stability of the Cartesian feedback linearizer circuit 400 while maximizing the correction of the Cartesian feedback linearizer circuit 400 (ACP improvement) at a set offset, such as 5 MHz for LTE. Thus, it is possible to improve the EVM of a transmitter due to loop correction and the efficiency of the transmitter as well.

In various embodiments of the present invention, the disclosed methods, such as the delay algorithm 500 and the adaptive algorithm 600, may be implemented as a computer program product for use with a computer system or microprocessor. The algorithms 600 may be embedded into circuitry, such as the phase training SAR circuitry and control 460, in integrated circuit 494, or into a separate circuitry, such as a microprocessor controller, which is within or connected to integrated circuit 494. Such implementations may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

While various embodiments of the invention have been described, it will be apparent to those of ordinary skill in the art that other embodiments and implementations are possible within the scope of the invention. Accordingly, the invention is not to be restricted except in light of the attached claims and their equivalents.

The invention claimed is:

1. An integrated circuit including a linearizer circuit, the linearizer circuit comprising:
    a power amplifier for transmitting a linearized radio signal;
    a forward path for routing a signal to be transmitted by the power amplifier, the forward path including a gain and low-pass filter having at least one programmable zero;
    a feedback path, operably coupled to the power amplifier and the forward path for feeding back a portion of the signal to be transmitted; and
    a microprocessor for applying a first phase training signal at a first frequency and a second phase training signal at a second frequency different from the first frequency to the forward path, wherein the microprocessor uses the first and second phase training signals to determine an amount of delay in the linearizer circuit, and to reprogram the at least one programmable zero responsive to determining the amount of delay in order to compensate for the amount of delay.

2. The integrated circuit of claim 1, wherein the microprocessor calculates the difference in phase between the first and second phase training signals to determine the amount of delay in the linearizer circuit.

3. The integrated circuit of claim 1, wherein the integrated circuit includes a quadrature generator having a phase shift which occurs inside the quadrature generator, wherein the microprocessor calculates the difference in phase between the first and second phase training signals and adds to the difference the phase shift that occurs inside the quadrature generator to determine the amount of delay in the linearizer circuit.

4. The integrated circuit of claim 1, wherein the microprocessor uses the first and second phase training signals in order to determine an amount of phase shift due to delay in the linearizer circuit.

5. A method for determining an amount of delay in a linearizer circuit used in a digital radio, the method comprising:
    applying a first phase training signal at a first frequency and a second phase training signal at a second frequency different from the first frequency to a forward path of the linearizer circuit, the forward path including a gain and low-pass filter having at least one programmable zero;
    determining the difference between the first and second phase training signals to determine an amount of delay in the linearizer circuit; and
    changing parameters within the linearizer circuit to compensate for the amount of delay, including reprogramming the at least one programmable zero responsive to determining the amount of delay.

6. The method of claim 5, wherein the second frequency is greater than the first frequency by at least 0.001%.

7. The method of claim 5, further comprising adding a measured phase shift $\gamma$ to the difference between the first and second phase training signals, wherein $\gamma$ is the measured phase shift for a quadrature generator connected with the linearizer circuit.

* * * * *